US009229315B2

(12) United States Patent
Hosoya

(10) Patent No.: US 9,229,315 B2
(45) Date of Patent: Jan. 5, 2016

(54) REFLECTIVE MASK BLANK AND METHOD OF MANUFACTURING A REFLECTIVE MASK

(71) Applicant: HOYA CORPORATION, Tokyo (JP)

(72) Inventor: Morio Hosoya, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 126 days.

(21) Appl. No.: 14/013,870

(22) Filed: Aug. 29, 2013

(65) Prior Publication Data

US 2014/0011122 A1      Jan. 9, 2014

Related U.S. Application Data

(62) Division of application No. 13/122,099, filed as application No. PCT/JP2009/071397 on Dec. 24, 2009, now Pat. No. 8,546,047.

(30) Foreign Application Priority Data

Dec. 26, 2008   (JP) ................................. 2008-332212

(51) Int. Cl.
    *G03F 1/22*   (2012.01)
    *G03F 1/24*   (2012.01)
    (Continued)

(52) U.S. Cl.
    CPC . *G03F 1/24* (2013.01); *B82Y 10/00* (2013.01); *B82Y 40/00* (2013.01); *G03F 1/22* (2013.01); *G03F 7/2002* (2013.01); *G03F 1/0092* (2013.01)

(58) Field of Classification Search
    CPC ..................................... G03F 1/22; G03F 1/24
    USPC ........................... 430/5; 378/35; 428/428, 430
    See application file for complete search history.

(56) References Cited

U.S. PATENT DOCUMENTS

| 2005/0208389 A1 | 9/2005 | Ishibashi et al. |
| 2008/0248409 A1 | 10/2008 | Ishibashi et al. |

(Continued)

FOREIGN PATENT DOCUMENTS

| JP | 8-213303 A | 8/1996 |
| JP | 2004-207593 A | 7/2004 |

(Continued)

OTHER PUBLICATIONS

Communication dated May 20, 2014, issued by the Japan Patent Office in corresponding application No. 2010-544111.

*Primary Examiner* — Stephen Rosasco
(74) *Attorney, Agent, or Firm* — Sughrue Mion, PLLC

(57) ABSTRACT

Provided are a reflective mask blank and a reflective mask which are capable of improving the contrast for inspection light having a wavelength of 200 nm or less in an inspection, capable of improving the contrast for exposure light in use of the mask, and capable of forming a high-resolution fine pattern. A reflective mask blank 10 includes a substrate 1, and a multilayer reflective film 2 adapted to reflect exposure light, a protective film 6 composed mainly of ruthenium (Ru) or its compound on the multilayer reflective film 2, and an absorber film 4 adapted to absorb the exposure light, which are formed in this order on the substrate. The absorber film 4 has a laminated structure including an uppermost layer 4b and a lower layer 4a. The uppermost layer 4b is formed of a material composed mainly of a nitride, an oxide, an oxynitride, a carbide, a carbonitride, or an oxycarbonitride of at least one or more elements selected from Si and Cr. A reflective mask 20 is obtained by forming a transfer pattern in the absorber film of the reflective mask blank.

18 Claims, 2 Drawing Sheets

(51) Int. Cl.
  *B82Y 10/00* (2011.01)
  *B82Y 40/00* (2011.01)
  *G03F 7/20* (2006.01)
  *G03F 1/00* (2012.01)

(56) References Cited

U.S. PATENT DOCUMENTS

2008/0318140 A1 12/2008 Hayashi et al.
2009/0011341 A1 1/2009 Hayashi et al.

FOREIGN PATENT DOCUMENTS

| | | |
|---|---|---|
| JP | 3806702 B2 | 8/2006 |
| JP | 2007-273656 A | 10/2007 |
| JP | 2007-335908 A | 12/2007 |
| JP | 2008-078551 A | 4/2008 |
| JP | 2008-118143 A | 5/2008 |
| JP | 2008535270 A | 8/2008 |
| WO | 2007068617 A1 | 6/2007 |

REFLECTIVE MASK BLANK AND METHOD OF MANUFACTURING A REFLECTIVE MASK

CROSS-REFERENCES TO RELATED PATENT APPLICATIONS

This is a Divisional of application Ser. No. 13/122,099 filed May 16, 2011, claiming priority based on International Application No. PCT/JP2009/071397 filed Dec. 24, 2009, claiming priority based on Japanese Patent Application No. 2008-332212, filed on Dec. 26, 2008, the disclosures of which are incorporated herein in their entirety by reference.

TECHNICAL FIELD

This invention relates to an exposure reflective mask for use in the manufacture of semiconductor devices or the like and to a reflective mask blank serving as a base for manufacturing the same.

BACKGROUND ART

In recent years, with higher integration of semiconductor devices, fine patterns exceeding the transfer limit of the photolithography technique have been required in the semiconductor industry. In view of this, the EUV lithography being an exposure technique using extreme ultraviolet (Extreme Ultra Violet: hereinafter referred to as EUV) light with a shorter wavelength is expected to be promising. Herein, the EUV light represents light in a wavelength band of the soft X-ray region or the vacuum ultraviolet region and, specifically, light having a wavelength of about 0.2 to 100 nm. As a mask for use in the EUV lithography, there is proposed an exposure reflective mask, for example, described in Patent Document 1 noted below.

This reflective mask has a multilayer reflective film formed on a substrate and adapted to reflect exposure light, a buffer film formed in a pattern on the multilayer reflective film, and further an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The light incident on the reflective mask mounted in an exposure apparatus (pattern transfer apparatus) is absorbed at a portion where the absorber film is present, but is reflected by the multilayer reflective film at a portion where the absorber film is not present so that an optical image is transferred onto a semiconductor substrate through a reflective optical system.

Such a reflective mask is manufactured, for example, through the following processes.

(1) A predetermined resist pattern is formed on an upper surface of a reflective mask blank in which the multilayer reflective film, the buffer film, and the absorber film are formed in this order on the substrate and, using the resist pattern as an etching mask, a predetermined pattern is formed in the absorber film by dry etching.

(2) Herein, using inspection light, an inspection is performed to check whether or not the pattern is formed as designed in the absorber film. In this event, the inspection is carried out by detecting inspection light reflected by the absorber film and inspection light reflected by the buffer film which is exposed by the removal of the absorber film, thereby observing the contrast therebetween.

(3) If, as a result of the inspection, it is found out that the pattern of the absorber film has a white or black defect, correction of a pinhole or the like is carried out by FIB-assisted deposition or the like for the white defect, while, correction is carried out by removing an unnecessary portion by FIB irradiation or the like for the black defect portion.

(4) Then, using as an etching mask the absorber film formed with the above-mentioned pattern, the buffer film is removed by dry etching according to the absorber film pattern, thereby transferring the pattern to the buffer film.

(5) Finally, using inspection light, a final confirmation inspection of the formed pattern is performed. In this event, the inspection is carried out by detecting inspection light reflected by the absorber film and inspection light reflected by the multilayer reflective film which is exposed by the removal of the absorber film and the buffer film, thereby observing the contrast therebetween.

PRIOR ART DOCUMENT

Patent Document

Patent Document 1: JP-A-H8-213303
Patent Document 2: Japanese Patent (JP-B) No. 3806702
Patent Document 3: JP-A-2004-207593

SUMMARY OF THE INVENTION

Problem to be Solved by the Invention

As described above, in the case of performing the pattern inspection after forming the predetermined pattern in the absorber film, the inspection is carried out by observing the contrast between the inspection light reflected by the absorber film and the inspection light reflected by the buffer film which is exposed by the removal of the absorber film and, in the case of performing the final confirmation inspection after transferring the absorber film pattern to the buffer film, the inspection is carried out by observing the contrast between the inspection light reflected by the absorber film and the inspection light reflected by the multilayer reflective film which is exposed by the removal of the absorber film and the buffer film. Therefore, an accurate pattern inspection cannot be carried out unless sufficient contrast is obtained between the absorber film and the buffer film or the multilayer reflective film. In view of this, Patent Document 2 describes a reflective mask blank such that an absorber film has a laminated structure comprising as a lower layer an absorber layer for exposure light such as EUV light and as an upper layer a low-reflection layer for inspection light, thereby improving the contrast to enable an accurate pattern inspection.

The multilayer reflective film is a multilayer film in which elements with different refractive indices are periodically laminated and, in general, use is made of a multilayer film in which thin films of a heavy element or its compound and thin films of a light element or its compound are alternately laminated by about 40 to 60 cycles. For example, as a multilayer reflective film for EUV light having a wavelength of 13 to 14 nm, use is preferably made of a Mo/Si cycle laminated film in which Mo films and Si films are alternately laminated by about 40 cycles. In order to increase the reflectance, the Mo film with a high refractive index is preferably used as an uppermost layer. However, Mo is easily oxidized when exposed to the air and thus, conversely, the reflectance decreases. In order to prevent this oxidation of the Mo film and in order for protection from cleaning with a chemical or the like in the manufacture of the reflective mask from the reflective mask blank, the Si film is used as an uppermost surface layer and is formed to a thickness greater than that of the lower Si films to thereby serve as a protective film. That is, it can be said that, substantially, the contrast for the inspection light is so adjusted as to be ensured between the absorber film and the protective film or the buffer film (in the case of providing the buffer film). However, there is a problem that if the Si film is formed thick as the protective film on the multilayer reflective film, the reflectance for the EUV light decreases. In order to solve this, a structure has recently started to be used in which a Si film having approximately the same thickness as that of lower layers of the same material is used as an uppermost surface layer of a multilayer reflective film and a protective film of a material composed mainly of Ru is provided on an upper surface thereof. In this case, the contrast for inspection light should be considered in terms of the protective film composed mainly of Ru.

On the other hand, as the low-reflection layer as an upper layer, use is made of, for example, a material containing Ta, B, and O. Conventionally, light having a wavelength of about 257 nm is normally used as the inspection light for use in the above-mentioned pattern inspection. In the case of the material containing Ta, B, and O, the reflectance for the inspection light having the wavelength of about 257 nm can be adjusted to a minimum by optimizing the film thickness. With further pattern miniaturization in recent years, a necessity has arisen to use, for example, ArF excimer laser light (wavelength 193 nm) or F2 excimer laser light (wavelength 157 nm) with a wavelength shorter than conventional, as inspection light for use in pattern inspection. However, in the case of the material containing Ta, B, and O, it is difficult to minimize the reflectance for inspection light having a wavelength of 200 nm or less even by adjusting the film thickness and thus the reflectance tends to be high. When Si is used as a material of the protective film, since the reflectance for the inspection light with the wavelength of 200 nm or less is very high, it is possible to ensure the contrast to a certain degree even if the reflectance of the absorber film is relatively high. However, when the material composed mainly of Ru is used as a material of the protective film, since the reflectance for the inspection light with the wavelength of 200 nm or less is not so high as in the case of Si, there is a problem that it is difficult to ensure the contrast if the reflectance of the absorber film is relatively high.

Further, in order to transfer a fine pattern to a semiconductor substrate or the like with high accuracy using the reflective mask, it is important to improve the mask contrast for exposure light such as EUV light.

As described in Patent Document 3, also in the case of the EUV lithography, there arises a problem of diffraction of light like in the light-transmission type lithography using ArF exposure light or the like and, therefore, an attempt is made to use the phase shift effect. That is, in this reflective mask, an absorber film has a transmittance adjusting function of reducing to a predetermined ratio the light intensity of reflected light of EUV exposure light which enters the inside of the absorber film from its surface, then is reflected by a multilayer reflective film, and then exits again from the surface of the absorber film and a phase adjusting function of providing a phase difference large enough to produce the phase shift effect with respect to reflected light of EUV exposure light which is directly reflected by the multilayer reflective film at a portion where the absorber film is not present. However, in the case of using a material composed mainly of Ru as a protective layer, there is a problem that the same Ru-based material cannot be used as the absorber film in which a transfer pattern is to be formed by dry etching.

Generally, in a reflective mask blank, the thickness of an absorber film having a function of absorbing exposure light is large and thus the thickness of a resist film which is necessary for etching this absorber film to form a pattern also becomes large. When the pattern line width required for a mask is reduced so that a pattern with a small line width is formed in a conventional thick resist (normally about 500 nm to 800 nm), firstly, the aspect ratio increases to cause a possibility of the occurrence of resist pattern collapse, secondly, it is difficult to ensure the vertical shape accuracy of the resist so that the shape accuracy of an absorber pattern is degraded, and thirdly, an etching gas is not supplied well to a narrow path of the resist pattern and a gas generated by etching tends to stay there so that the etching reaction does not proceed well at a portion with a narrow line width, and therefore, there occurs a difference in etching rate between portions with a broad line width and a narrow line width so that uniform etching cannot be carried out in the plane of the mask. Accordingly, with the use of the conventional thick resist, it is difficult to form a fine pattern with a small line width such as, for example, with a resolution of 50 nm or less.

Therefore, firstly, it is an object of this invention to provide a reflective mask blank which is improved in contrast, in an inspection, for inspection light with a wavelength of 200 nm or less for use in pattern inspection even in the case where a material composed mainly of Ru is used as a protective film, and a reflective mask manufactured using such a reflective mask blank. Secondly, it is an object of this invention to provide a reflective mask blank which is improved in contrast for exposure light when a reflective mask manufactured from the reflective mask blank is used, and a reflective mask manufactured using such a reflective mask blank. Thirdly, it is an object of this invention to provide a reflective mask blank which uses the phase shift effect even in the case where a material composed mainly of Ru is used as a protective film, and a reflective mask manufactured using such a reflective mask blank. Fourthly, it is an object of this invention to provide a reflective mask blank which is capable of forming a high-resolution fine pattern, and a reflective mask manufactured using such a reflective mask blank.

Means for Solving the Problem

In order to solve the above-mentioned problems, this invention has the following structures.

(Structure 1)

A reflective mask blank, comprising a substrate, a multilayer reflective film formed on the substrate and adapted to reflect exposure light, and an absorber film formed on the multilayer reflective film and adapted to absorb the exposure light, wherein the absorber film has a laminated structure comprising an uppermost layer and a lower layer other than the uppermost layer, the uppermost layer is formed of a material composed mainly of a nitride, an oxide, an oxynitride, a carbide, a carbonitride, or an oxycarbonitride of at least one or more elements selected from silicon (Si) and chromium (Cr), and a protective film composed mainly of ruthenium (Ru) or its compound is provided between the multilayer reflective film and the absorber film.

According to the Structure 1, the uppermost layer of the absorber film is formed of a material composed mainly of a nitride, an oxide, an oxynitride, a carbide, a carbonitride, or an oxycarbonitride of at least one or more elements selected from silicon (Si) and chromium (Cr). As a consequence, the reflectance for inspection light having a wavelength of 200 nm or less can be minimized and, therefore, even if the material composed mainly of ruthenium (Ru) or its compound whose reflectance for the inspection light is not so high is used as the protective film, it is possible to provide the reflective mask blank which is improved in contrast in a pattern inspection.

Further, since the uppermost layer of the absorber film is formed of a material composed mainly of a nitride, an oxide, an oxynitride, a carbide, a carbonitride, or an oxycarbonitride of at least one or more elements selected from silicon (Si) and chromium (Cr), it is possible to provide the reflective mask blank in which the uppermost layer has an increased transmittance for exposure light when a reflective mask manufactured from the reflective mask blank is used and which is improved in mask contrast for the exposure light.

In the case of a tantalum-based material with high absorptance for EUV exposure light, the adjustment width of transmittance is relatively narrow. On the other hand, according to the Structure 1, since the uppermost layer of the absorber film is formed of a material composed mainly of a nitride, an oxide, an oxynitride, a carbide, a carbonitride, or an oxycarbonitride of at least one or more elements selected from silicon (Si) and chromium (Cr), it becomes easier to adjust the transmittance for the EUV exposure light over the entire absorber film and thus to adjust the phase difference.

(Structure 2)

The reflective mask blank according to Structure 1, wherein the lower layer of the absorber film is formed of a material composed mainly of a nitride, an oxide, an oxynitride, a carbide, a carbonitride, or an oxycarbonitride of chromium (Cr).

According to the Structure 2, further, the lower layer of the absorber film also uses a chromium-based material (material composed mainly of a nitride, an oxide, an oxynitride, a carbide, a carbonitride, or an oxycarbonitride of chromium (Cr)) with low absorptance for the EUV exposure light as compared with the tantalum-based material. Therefore, it becomes further easier to adjust the transmittance for the EUV exposure light over the entire absorber film and thus to adjust the phase difference.

The chromium-based material forming the lower layer of the absorber film is dry-etched by an etching gas in the form of a mixed gas of chlorine and oxygen while the ruthenium-based material (material composed mainly of ruthenium (Ru) or its compound) forming the protective film has high resistance to this etching gas. Therefore, the protective film can also serve as an etching stopper.

(Structure 3)

The reflective mask blank according to Structure 1, wherein the uppermost layer of the absorber film is formed of a material composed mainly of a nitride, an oxide, an oxynitride, a carbide, a carbonitride, or an oxycarbonitride of silicon (Si), and a buffer film composed mainly of chromium (Cr) is provided between the protective film and the absorber film.

According to the Structure 3, since the uppermost layer formed of a silicon-based material (material composed mainly of a nitride, an oxide, an oxynitride, a carbide, a carbonitride, or an oxycarbonitride of silicon (Si)) has high resistance to dry etching by a mixed gas of chlorine and oxygen, the buffer film can be formed of the chromium-based material (material composed mainly of chromium) which is dry-etched by this etching gas.

(Structure 4)

The reflective mask blank according to Structure 3, wherein the lower layer of the absorber film is formed of a material composed mainly of tantalum (Ta).

According to the Structure 4, the silicon-based material which is dry-etched by a fluorine-based gas is used as the uppermost layer of the absorber film while the tantalum-based material which is dry-etched by a chlorine gas is used as the lower layer of the absorber film. Therefore, the uppermost layer can serve as an etching mask. As a consequence, it is possible to form a high-resolution fine pattern. Further, since the ruthenium-based material forming the protective film has high resistance to a chlorine-based gas, the protective film can also serve as an etching stopper.

(Structure 5)

The reflective mask blank according to any one of Structures 1 to 4, wherein the uppermost layer of the absorber film has a thickness which is optimized to minimize a reflectance for inspection light having a wavelength of 200 nm or less for use in pattern inspection.

According to the Structure 5, in the case of the silicon-based material or the chromium-based material which is used as the uppermost layer of the absorber film, the reflectance for the inspection light having the wavelength of 200 nm or less can be minimized, and therefore, it is possible to improve the contrast in a pattern inspection to thereby carry out an accurate pattern inspection.

(Structure 6)

The reflective mask blank according to any one of Structures 1 to 5, wherein the protective film is composed mainly of a ruthenium compound containing ruthenium (Ru) and niobium (Nb).

According to the Structure 6, when a reflective mask is manufactured from this reflective mask blank, the protective film is exposed so that a niobium oxide layer is formed as a surface layer of this protective film. As a consequence, the chemical resistance in mask cleaning is improved. In particular, the resistance to ozone water cleaning is very high and thus it is possible to prevent a reduction in exposure light reflectance. Particularly in the case of a structure where the buffer film composed mainly of chromium is formed in contact with an upper surface of the protective film, the protective film has high resistance to a mixed gas of chlorine and oxygen during dry etching of the buffer film.

(Structure 7)

A method of manufacturing a reflective mask, comprising: forming an absorber film pattern, which serves as a transfer pattern for a transfer target, in the absorber film of the reflective mask blank according to any one of Structures 1 to 6.

By manufacturing the reflective mask using the reflective mask blank according to any of the above-mentioned Structures 1 to 6, there is obtained the reflective mask which improves the contrast, in an inspection, for inspection light with a wavelength of 200 nm or less for use in pattern inspection, which improves the contrast for exposure light in use of the mask, and which has the phase shift effect.

Effect of the Invention

According to this invention, it is possible to provide a reflective mask blank which is improved in contrast, in an inspection, for inspection light with a wavelength of 200 nm or less for use in pattern inspection even in the case where a material composed mainly of Ru is used as a protective film, and a reflective mask manufactured using such a reflective mask blank.

Further, according to this invention, it is possible to provide a reflective mask blank which is improved in contrast for exposure light when a reflective mask manufactured from the reflective mask blank is used, and a reflective mask manufactured using such a reflective mask blank. It is possible to provide a reflective mask blank which uses the phase shift effect even in the case where a material composed mainly of Ru is used as a protective film, and a reflective mask manufactured using such a reflective mask blank.

Further, according to this invention, it is possible to provide a reflective mask blank which is capable of forming a high-resolution fine pattern, and a reflective mask manufactured using such a reflective mask blank.

MODE FOR CARRYING OUT THE INVENTION

Figure 1:
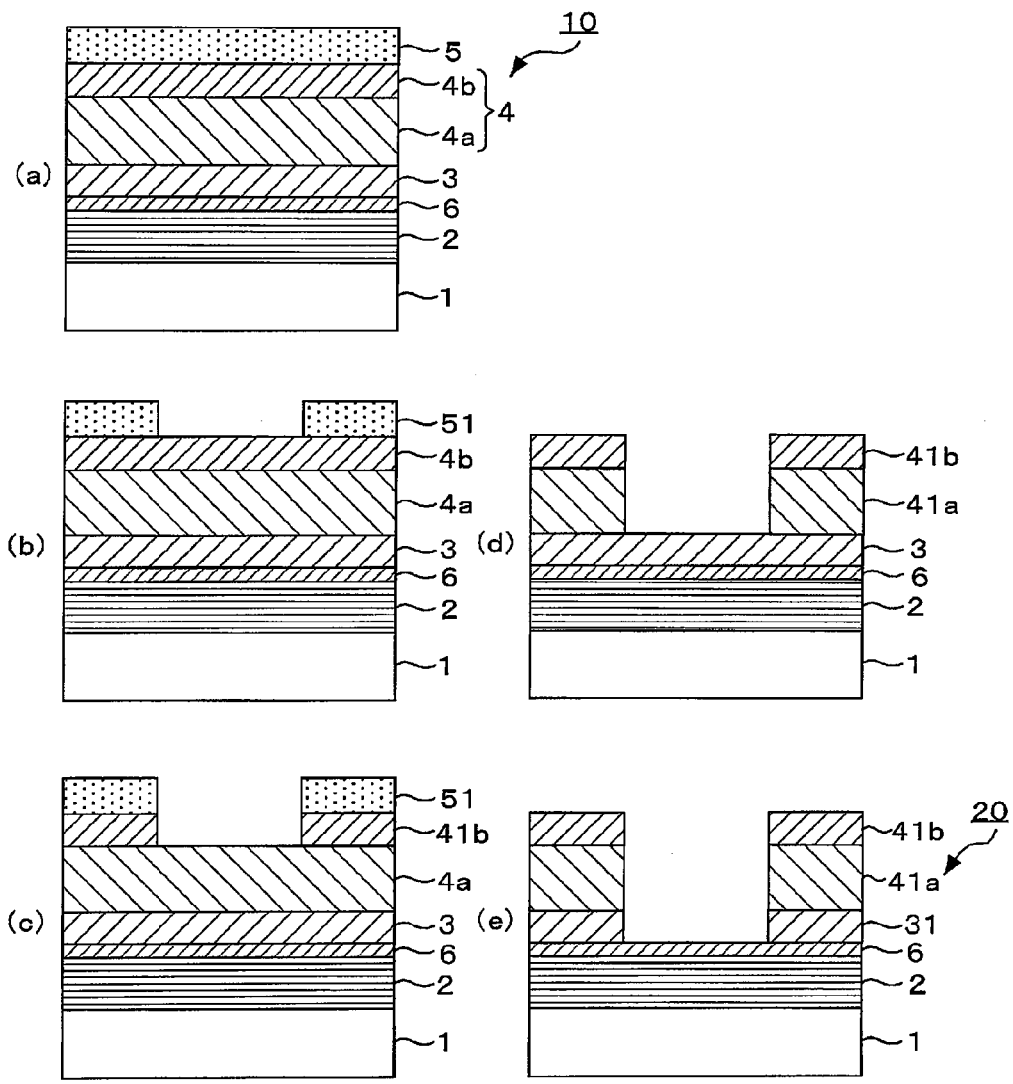
FIG. 1 is cross-sectional views showing the structure of an embodiment of a reflective mask blank and showing processes of manufacturing a reflective mask using this mask blank.

Hereinbelow, this invention will be described in detail with reference to an embodiment thereof.

A reflective mask blank according to this invention comprises a substrate, a multilayer reflective film formed on the substrate and adapted to reflect exposure light, and an absorber film formed on the multilayer reflective film and adapted to absorb the exposure light. The absorber film has a laminated structure comprising an uppermost layer and a lower layer other than the uppermost layer. The uppermost layer is formed of a material composed mainly of a nitride, an oxide, an oxynitride, a carbide, a carbonitride, or an oxycarbonitride of at least one or more elements selected from silicon (Si) and chromium (Cr). A protective film composed mainly of ruthenium (Ru) or its compound is provided between the multilayer reflective film and the absorber film.

According to this reflective mask blank, there are obtained a reflective mask blank and a reflective mask having the following effects.

(1) The reflectance for inspection light having a wavelength of 200 nm or less for use in pattern inspection can be minimized. Therefore, even if the material composed mainly of ruthenium (Ru) or its compound whose reflectance for the inspection light is not so high is used as the protective film, it is possible to obtain sufficient contrast for the inspection light between the absorber film and the multilayer reflective film (protective film). As a consequence, it is possible to improve the contrast when the short-wavelength light having the wavelength of 200 nm or less is used in the pattern inspection and thus to carry out the accurate pattern inspection of the mask formed with a fine pattern. The contrast for the inspection light in the pattern inspection represents a value defined by contrast (=reflectance ratio)=inspection light reflectance from the absorber film: inspection light reflectance from the multilayer reflective film having the protective film (or a buffer film)=1: (inspection light reflectance from the multilayer reflective film having the protective film (or the buffer film)/inspection light reflectance from the absorber film).

(2) It is possible to increase the exposure light transmittance of the uppermost layer in use of the mask and to improve the mask contrast for, for example, EUV light as exposure light so that pattern transfer of a fine pattern can be carried out with high accuracy.

The mask contrast represents a value defined by a contrast of a reflective mask for use with, for example, EUV light as exposure light, that is, contrast=reflectance ratio=1: (reflectance from the multilayer reflective film having the protective film/reflectance from the absorber film).

(3) Using, as the uppermost layer of the absorber film, a material which is composed mainly of a nitride, an oxide, an oxynitride, a carbide, a carbonitride, or an oxycarbonitride of at least one or more elements selected from silicon (Si) and chromium (Cr) and thus has low absorptance for the EUV exposure light as compared with a tantalum-based material, it becomes easier to adjust the transmittance for the EUV exposure light over the entire absorber film and thus to adjust the phase difference for the EUV exposure light.

The uppermost layer of the absorber film in this invention is formed of a material composed mainly of a nitride, an oxide, an oxynitride, a carbide, a carbonitride, or an oxycarbonitride of at least one or more elements selected from silicon (Si) and chromium (Cr) and, as typical compound examples of a nitride, an oxide, an oxynitride, a carbide, a carbonitride, and an oxycarbonitride of silicon (Si), there can be cited, for example, $Si_3N_4$, $SiO_2$, SiON, SiC, and so on. The silicon compound may further contain a transition metal such as Mo with a relatively small atomic weight. When the above-mentioned material is used as the uppermost layer of the absorber film, it is preferable to set the N content of the material to a range of 15 to 60 at % and the O content of the material to a range of 15 to 60 at % in order to minimize the reflectance for the inspection light having the wavelength of 200 nm or less.

As typical compound examples of a nitride, an oxide, an oxynitride, a carbide, a carbonitride, and an oxycarbonitride of chromium (Cr), there can be cited, for example, CrN, CrNO, CrOCN, and so on. When this material is used as the uppermost layer of the absorber film, it is preferable to set the N content of the material to a range of 15 to 60 at % and the O content of the material to a range of 15 to 60 at % in order to minimize the reflectance for the inspection light having the wavelength of 200 nm or less.

The material forming the uppermost layer of the absorber film may further contain boron (B). By containing B, it is possible to further improve the amorphous properties and the surface smoothness of the film.

While the thickness of the uppermost layer of the absorber film can be set to about 5 to 30 nm, since the material forming the uppermost layer in this invention can be minimized in reflectance for the inspection light having the wavelength of 200 nm or less for use in pattern inspection, it is preferable to optimize the film thickness so as to minimize the reflectance.

The lower layer of the absorber film is preferably formed of a material composed mainly of a nitride, an oxide, an oxynitride, a carbide, a carbonitride, or an oxycarbonitride of chromium (Cr). Since the lower layer of the absorber film also uses a chromium-based material (material composed mainly of a nitride, an oxide, an oxynitride, a carbide, a carbonitride, or an oxycarbonitride of chromium (Cr)) with low absorptance for the EUV exposure light as compared with the tantalum-based material, it becomes further easier to adjust the transmittance for the EUV exposure light over the entire absorber film and thus to adjust the phase difference.

The chromium-based material forming the lower layer of the absorber film is dry-etched by an etching gas in the form of a mixed gas of chlorine and oxygen while the ruthenium-based material (material composed mainly of ruthenium (Ru) or its compound) forming the protective film has high resistance to this etching gas. Therefore, the protective film can also serve as an etching stopper. As specific examples of the chromium-based material, there can be cited the same specific examples of the chromium-based material for use in the uppermost layer described above.

In this invention, the lower layer of the absorber film may be formed of a tantalum-based material mainly containing tantalum (Ta). Particularly in the case where the uppermost layer of the absorber film is formed of a material composed mainly of a nitride, an oxide, an oxynitride, a carbide, a carbonitride, or an oxycarbonitride of silicon (Si), the lower layer of the absorber film is preferably formed of the tantalum-based material mainly containing tantalum (Ta). Using, as the uppermost layer of the absorber film, the silicon-based material which is dry-etched by a fluorine-based gas and using, as the lower layer of the absorber film, the tantalum-based material which is dry-etched by a chlorine gas, the uppermost layer can serve as an etching mask. As a consequence, it is possible to form a high-resolution fine pattern. Further, since the ruthenium-based material forming the protective film has high resistance to a chlorine-based gas, the protective film can also serve as an etching stopper.

In this invention, it is particularly preferable that the lower layer of the absorber film be formed of a tantalum-based material containing tantalum (Ta), boron (B), and nitrogen (N). By containing B, it is possible to further improve the amorphous properties and the surface smoothness of the absorber film. By containing N, the film stress of the absorber film is reduced and the adhesion to the underlying buffer film or multilayer reflective film becomes excellent.

Either of the uppermost layer and the lower layer of the absorber film does not necessarily have a uniform composition over its entirety and, for example, each may have a composition gradient so that the composition changes in a thickness direction of the film. In the composition gradient, the composition of contained elements may change continuously or stepwise.

The buffer film having etching characteristics different from those of the absorber film may be formed between the multilayer reflective film and the absorber film. By forming such a buffer film, the multilayer reflective film is prevented from being damaged due to etching during pattern formation and pattern correction of the absorber film. In particular, high smoothness can be obtained with the buffer film made of a chromium-based material containing chromium and therefore a surface of the absorber film formed thereon can also obtain high smoothness so that pattern blur can be reduced. As the chromium-based buffer film material, use can be made of chromium (Cr) alone or a material containing chromium (Cr) and at least one or more kinds of elements selected from nitrogen (N), oxygen (O), carbon (C), and fluorine (F). For example, the smoothness can be made excellent by containing nitrogen, the etching resistance under dry etching conditions of the absorber film can be improved by containing carbon, and the film stress can be reduced by containing oxygen. Specifically, materials such as CrN, CrO, CrC, CrF, CrON, CrCO, and CrCON can be preferably cited.

Each of the above-mentioned reflective mask blanks may be in a state where a resist film for forming a predetermined transfer pattern in the uppermost layer of the absorber film is formed.

As reflective masks obtained using the above-mentioned reflective mask blanks, the following aspects are cited.

(1) A reflective mask in which a protective film is provided on an upper surface of a multilayer reflective film formed on a substrate and a pattern of a buffer film and an absorber film in the form of a predetermined transfer pattern is formed on the protective film.

(2) A reflective mask in which a protective film is provided on an upper surface of a multilayer reflective film formed on a substrate and an absorber film pattern in the form of a predetermined transfer pattern is formed on the protective film.

FIG. 1 is schematic cross-sectional views showing an embodiment of a reflective mask blank of this invention and showing processes of manufacturing a reflective mask using this mask blank.

As shown in FIG. 1(a), the embodiment of the reflective mask blank of this invention has a structure in which a multilayer reflective film 2 is formed on a substrate 1, a protective film 6 is formed on the multilayer reflective film 2, and, further, a buffer film 3 and an absorber film 4 having a laminated structure of a lower layer 4a and an uppermost layer 4b are formed on the protective film 6. Further, a resist film 5 is provided on an upper surface of the absorber film 4.

In order to prevent pattern deformation due to heat during exposure, the substrate 1 preferably has a low thermal expansion coefficient in the range of $0 \pm 1.0 \times 10^{-7}/°$ C. and more preferably in the range of $0 \pm 0.3 \times 10^{-7}/°$ C. As a material having a low thermal expansion coefficient in this range, it is possible to use any of an amorphous glass, a ceramic, and a metal. For example, use can be made of a $SiO_2$—$TiO_2$-based glass or a quartz glass in the case of an amorphous glass or of a crystallized glass precipitated with β-quartz solid solution or the like in the case of a crystallized glass. As an example of a metal substrate, an Invar alloy (Fe—Ni-based alloy) or the like can be cited. It is also possible to use a single-crystal silicon substrate.

Further, in order to obtain high reflectance and high transfer accuracy, the substrate 1 preferably has high smoothness and flatness. In particular, the substrate 1 preferably has a surface with a smoothness of 0.2 nm or less in Rms (smoothness in a 10 μm square area) and a flatness of 50 nm or less (flatness in a 142 mm square area of a substrate main surface). Further, the substrate 1 preferably has high rigidity in order to prevent deformation thereof due to the film stress of a film to be formed thereon. In particular, the substrate 1 preferably has a high Young's modulus of 65 GPa or more.

The unit Rms representing the smoothness is a root mean square roughness which can be measured by an atomic force microscope. The flatness is a value representing a warp (deformation amount) of a surface given by TIR (Total Indicated Reading) and, assuming that a plane determined by the method of least squares on the basis of a substrate surface is given as a focal plane, the flatness is an absolute value of a height difference between the highest position of the substrate surface located above the focal plane and the lowest position of the substrate surface located below the focal plane.

The multilayer reflective film 2 is, as described before, a multilayer film in which elements with different refractive indices are periodically laminated and, in general, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of the aforementioned Mo/Si cycle laminated film in which Mo films and Si films are alternately laminated by about 40 cycles. As other multilayer reflective films for use in the region of the EUV light, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and so on. The material may be properly selected according to the exposure wavelength.

The multilayer reflective film 2 can be formed by depositing each layer by DC magnetron sputtering, ion beam sputtering, or the like. In the case of the above-mentioned Mo/Si cycle multilayer film, using, for example, the ion beam sputtering, a Si target is first used to form a Si film having a thickness of about several nm, then a Mo target is used to form a Mo film having a thickness of about several nm and, given that this forms one cycle, Si and Mo films are laminated by 40 to 60 cycles and, finally, a Si film is formed.

In this embodiment, the protective film 6 made of ruthenium (Ru) or its compound is provided between the multilayer reflective film 2 and the buffer film 3. With this protective film 6, the multilayer reflective film is prevented from being damaged due to etching during pattern formation of the buffer film so that it is possible to prevent a reduction in exposure light reflectance. As a typical ruthenium compound of the protective film in this invention, there can be cited, for example, RuNb, RuZr, or the like.

As the buffer film 3, the above-mentioned chromium-based buffer film can be preferably used, for example. The buffer film 3 can be formed on the protective film by sputtering such as ion beam sputtering other than DC sputtering or RF sputtering.

When performing correction of an absorber film pattern using, for example, a focused ion beam (FIB), the thickness of the buffer film 3 is preferably set to about 20 to 60 nm, but when correction is performed using an electron beam or the like, it can be set to about 5 to 15 nm.

Next, the absorber film 4 has a function of absorbing, for example, the EUV light as the exposure light and, in this invention, has the laminated structure of the lower layer 4a and the uppermost layer 4b. The uppermost layer 4b is as described before. In this invention, as described before, the material composed mainly of tantalum (Ta), for example, can be preferably used as the lower layer 4a. The material composed mainly of Ta is normally an alloy of Ta. In terms of smoothness and flatness, the crystalline state of this absorber film preferably has an amorphous or microcrystalline structure.

As the material composed mainly of Ta, use can be made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like. By adding B, Si, Ge, or the like to Ta, an amorphous material can be easily obtained to improve the smoothness. On the other hand, by adding N or O to Ta, the resistance to oxidation is improved and therefore there is obtained an effect of improving the temporal stability.

A particularly preferable materials among them, there can be cited, for example, the material containing Ta and B (composition ratio Ta/B is in the range of 8.5/1.5 to 7.5/2.5) and the material containing Ta, B, and N (when N is 5 to 30 at % and the balance is given as 100, B is 10 to 30 at %). In the case of this material, it is possible to easily obtain a microcrystalline or amorphous structure and thus to obtain excellent smoothness and flatness.

The uppermost layer of the absorber film and the lower layer, composed mainly of Ta, of the absorber film are preferably formed by sputtering such as magnetron sputtering. For example, in the case of a TaBN film, it can be formed by sputtering using a target containing tantalum and boron and using an argon gas added with nitrogen. In the case of the film formation by sputtering, the internal stress can be controlled by changing the power and the introducing gas pressure applied to the sputtering target. Further, since the film formation is enabled at a low temperature such as about room temperature, the thermal influence to the multilayer reflective film and so on can be made small.

The thickness of the uppermost layer 4b of the absorber film 4 is as described before, while, the lower layer 4a is required to have a thickness that can sufficiently absorb, for example, the EUV light as the exposure light and it is normally about 50 to 100 nm. On the other hand, the thickness may be set to as thin as about 25 to 50 nm in the case of producing the phase shift effect for the EUV exposure light using the absorber film 4.

In the embodiment shown in FIG. 1, the reflective mask blank 10 is configured as described above and thus has the buffer film. However, according to a method of forming a pattern of the absorber film 4 or a method of correcting the formed pattern, the reflective mask blank 10 may be configured such that the buffer film is not provided.

Next, a description will be given of the processes of manufacturing a reflective mask using the reflective mask blank 10.

The materials and the forming methods of the respective layers of the reflective mask blank 10 (see FIG. 1($a$)) are as described above.

A predetermined transfer pattern is formed in the uppermost layer 4b of the absorber film 4 of the reflective mask blank 10. First, the resist film 5 on the absorber film 4 is subjected to predetermined pattern writing by the use of an electron beam writing apparatus and then to development, thereby forming a predetermined resist pattern 51 (see FIG. 1($b$)).

Using the formed resist pattern 51 as a mask, the uppermost layer 4b of the absorber film 4 is dry-etched to thereby form an uppermost layer pattern 41b in the form of the predetermined transfer pattern (see FIG. 1($c$)). In the case where the uppermost layer 4b is made of, for example, a material containing a nitride of Si, use can be made of dry etching using a fluorine-based gas such as $SF_6$ or $CHF_3$.

The resist pattern 51 remaining on the uppermost layer pattern 41b is removed and then, using the formed uppermost layer pattern 41b as a mask, the lower layer 4a of the absorber film 4 is dry-etched to thereby form a lower layer pattern 41a in the form of the predetermined transfer pattern (see FIG. 1($d$)). In the case where the lower layer 4a is made of a material composed mainly of Ta, use can be made of dry etching using a chlorine gas.

Normally, an inspection is carried out herein to check whether or not the absorber film pattern (laminated pattern of the lower layer pattern 41a and the uppermost layer pattern 41b) is formed as designed. The inspection is carried out by causing inspection light for use in pattern inspection to be incident on a mask formed with the absorber film pattern and detecting the inspection light reflected by the uppermost layer pattern 41b and the inspection light reflected by the buffer film 3 exposed due to the removal of the absorber film 4 to thereby observe the contrast therebetween. In this invention, the reflectance of the uppermost layer pattern 41b for the inspection light having the wavelength of 200 nm or less can be minimized so that sufficient contrast for the inspection light can be obtained between the absorber film 4 and the buffer film 3, and therefore, it is possible to carry out an accurate pattern inspection.

In this manner, detection is carried out for, for example, a pinhole defect (white defect) formed by the removal of the absorber film 4 at a portion that should not be removed or an etching insufficient defect (black defect) where part of the absorber film 4 is not removed and thus remains due to insufficient etching. If such a pinhole defect or an etching insufficient defect is detected, correction thereof is carried out.

For correcting the pinhole defect, there is, for example, a method of depositing a carbon film or the like in a pinhole by FIB-assisted deposition. On the other hand, for correcting the etching insufficient defect, there is, for example, a method of removing an unnecessary portion by FIB irradiation. In this event, the buffer film 3 serves as a protective film for protecting the multilayer reflective film 2 against the FIB irradiation.

After the pattern inspection and correction have been finished as described above, the exposed buffer film 3 is removed according to the absorber film pattern so as to be formed into a pattern 31, thereby manufacturing a reflective mask 20 (see FIG. 1(e)). Herein, for example, in the case where the buffer film is made of a Cr-based material, use can be made of dry etching using a mixed gas containing chlorine and oxygen. At a portion where the buffer film is removed, the multilayer reflective film 2 as a reflection area for the exposure light is exposed. The protective film 6 is formed on the exposed multilayer reflective film. In this event, the protective film 6 protects the multilayer reflective film 2 against dry etching of the buffer film 3.

Lastly, an inspection is carried out to finally confirm whether or not the absorber film pattern is formed with dimensional accuracy according to a specification. Also in this final confirmation inspection, the above-mentioned inspection light is used. In this invention, since sufficient contrast for the inspection light having the wavelength of 200 nm or less can be obtained between the absorber film 4 and the multilayer reflective film 2 having the protective film 6 on its surface, it is possible to carry out an accurate pattern inspection.

The reflective mask manufactured using the reflective mask blank of this invention is particularly suitable for the case where EUV light (wavelength: about 0.2 to 100 nm) is used as exposure light, but is also properly applicable to light of other wavelengths.

EXAMPLES

Hereinbelow, the embodiment of this invention will be described in further detail with reference to Examples.

Example 1

A substrate to be used was a $SiO_2$—$TiO_2$-based glass substrate (152.4 mm square, thickness 6.35 mm). This substrate had a thermal expansion coefficient of $0.2\times10^{-7}$/° C. and a Young's modulus of 67 GPa. Then, this glass substrate was mechanically polished so as to have a surface with a smoothness of 0.2 nm or less in Rms and a flatness of 50 nm or less.

As a multilayer reflective film to be formed on the substrate, a Mo film/Si film cycle multilayer reflective film was employed so as to obtain the multilayer reflective film suitable for an exposure light wavelength band of 13 to 14 nm. That is, the multilayer reflective film was formed by using a Mo target and a Si target and alternately laminating films on the substrate by ion beam sputtering. A Si film was formed to 4.2 nm and a Mo film was formed to 2.8 nm and, given that this formed one cycle, films were laminated by 40 cycles, then a Si film was formed to 4.2 nm, and finally a RuNb film was formed to 2.5 nm as a protective film using a RuNb target (at % ratio Ru:Nb=20:80).

In this manner, a multilayer reflective film coated substrate was obtained. Reflectance was measured by applying EUV light of 13.5 nm to the multilayer reflective film at an incident angle of 6.0 degrees and it was 66.1%.

Then, a buffer film was formed on the protective film of the multilayer reflective film coated substrate thus obtained. As the buffer film, a chromium nitride film was formed to a thickness of 10 nm. The buffer film was formed by DC magnetron sputtering using a Cr target and using a mixed gas of argon (Ar) and nitrogen ($N_2$) as a sputtering gas. In the formed $CrN_x$ film, nitrogen (N) was 10 at % (x=0.1).

Then, on the buffer film, a material containing Ta, B, and N was deposited to a thickness of 80 nm as a lower layer of an absorber film. That is, the lower layer was formed by DC magnetron sputtering using a target containing Ta and B and adding nitrogen ($N_2$) in an amount of 10% to argon (Ar). The composition ratio of the formed TaBN film was such that Ta was 80 at %, B was 10 at %, and N was 10 at %.

Subsequently, a material containing SiON was deposited to a thickness of 20 nm as an uppermost layer of the absorber film. That is, the uppermost layer was formed by DC magnetron sputtering using a Si target in a mixed gas in which nitrogen ($N_2$) and oxygen ($O_2$) were added to argon (Ar). The thickness of the uppermost layer was set so as to minimize the reflectance when ArF excimer laser light (wavelength 193 nm) was used as pattern inspection light. The composition ratio of the SiON film was such that Si was 36 at %, O was 45 at %, and N was 19 at %.

In the manner described above, a reflective mask blank of this Example was manufactured.

Then, using this reflective mask blank, an EUV exposure reflective mask having a pattern of the DRAM hp32 nm generation of the design rule was manufactured in the following manner.

First, a resist film for electron beam writing was formed on the reflective mask blank, then predetermined pattern writing was carried out using an electron beam writing apparatus, and then development was carried out after the pattern writing, thereby forming a resist pattern. The thickness of the resist film was set to 100 nm which was thinner than conventional.

Then, using this resist pattern as a mask, the uppermost layer of the absorber film was dry-etched using a fluorine-based ($SF_6$) gas, thereby forming a transfer pattern in the uppermost layer. The remaining resist pattern was removed and then, using as a mask the uppermost layer formed with the transfer pattern, the lower layer of the absorber film was dry-etched using a chlorine gas, thereby forming a laminated transfer pattern of the lower layer and the uppermost layer in the absorber film.

At this stage, a pattern inspection of the absorber film was carried out using ArF excimer laser light (wavelength 193 nm) as inspection light. The contrast for the ArF excimer laser inspection light was such that reflectance from the absorber film: reflectance from the buffer film=9.5%:53.1%=1:5.59. Thus, it was confirmed that it was possible to obtain sufficient contrast in the pattern inspection of the absorber film.

Further, using a mixed gas of chlorine and oxygen, the buffer film remaining in a reflection area (portion with no pattern of the absorber film) was removed by dry etching according to the pattern of the absorber film, thereby exposing the multilayer reflective film having the protective film on its surface. In this manner, a reflective mask was obtained.

Lastly, a final confirmation inspection of the obtained reflective mask was carried out using ArF excimer laser light (wavelength 193 nm) as inspection light. The contrast for the ArF excimer laser inspection light was such that reflectance from the absorber film: reflectance from the multilayer reflective film having the protective film=9.5%:58.2%=1:6.13. Thus, it was confirmed that it was possible to obtain sufficient contrast in the pattern inspection of the absorber film. Further, as a result of the pattern inspection of the reflective mask, it was confirmed that a pattern of the DRAM hp32 nm generation of the design rule was formed as designed. Further, the reflectance for EUV exposure light in the reflection area hardly changed as compared with the reflectance measured in the form of the multilayer reflective film coated substrate and it was 66.0%.

Figure 2:
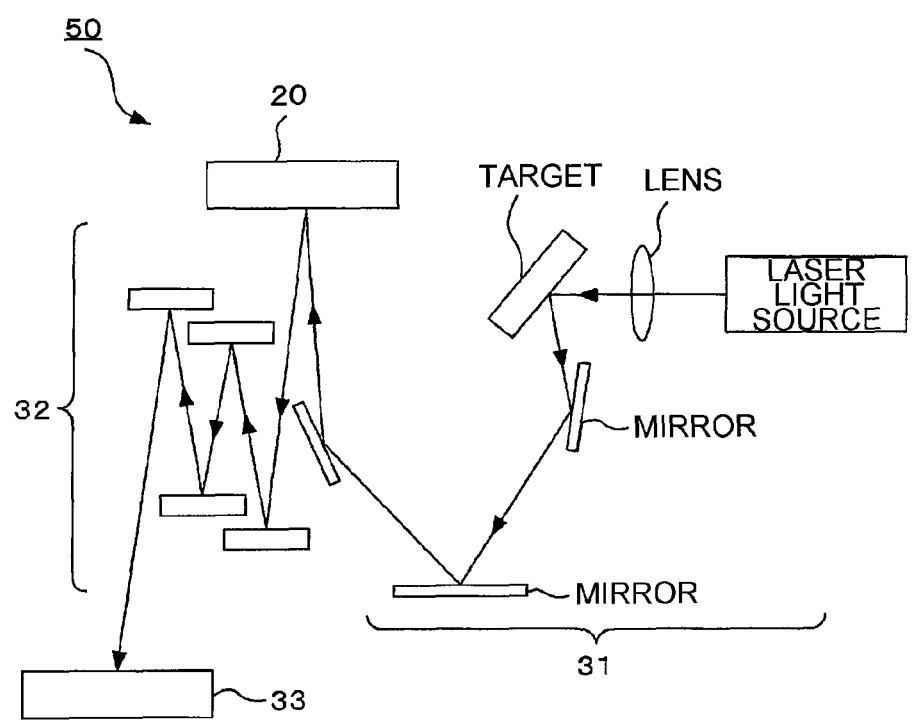
FIG. 2 is a diagram showing a schematic structure of a pattern transfer apparatus in which a reflective mask is mounted.

Then, using the obtained reflective mask of this Example, exposure transfer with EUV light onto a semiconductor substrate was carried out by the use of a pattern transfer apparatus shown in FIG. 2.

The pattern transfer apparatus 50 with the reflective mask mounted therein is roughly formed by a laser plasma X-ray source 31, a reduction optical system 32, and so on. The reduction optical system 32 uses X-ray reflecting mirrors. A pattern reflected from the reflective mask 20 is normally reduced in size to about a quarter through the reduction optical system 32. Since a wavelength band of 13 to 14 nm was used as an exposure wavelength, it was set in advance that an optical path was located in a vacuum.

In this state, the EUV light obtained from the laser plasma X-ray source 31 was incident on the reflective mask 20 and the light reflected therefrom was transferred onto a silicon wafer (resist layer coated semiconductor substrate) 33 through the reduction optical system 32.

The light incident on the reflective mask 20 is absorbed by the absorber film and thus is not reflected at a portion where the absorber film pattern is present, while it is reflected by the multilayer reflective film at a portion where the absorber film pattern is not present. In this manner, an image formed by the light reflected from the reflective mask 20 enters the reduction optical system 32. The exposure light through the reduction optical system 32 exposes a transfer pattern onto a resist layer of the silicon wafer 33. Then, by developing the exposed resist layer, a resist pattern is formed on the silicon wafer 33.

The pattern transfer onto the semiconductor substrate was carried out in the manner described above and it was confirmed that the mask contrast of the reflective mask of this Example was as high as 1:1000 at a peak wavelength and as high as 1:250 even over the entire wavelength band of the EUV light and that the mask accuracy thereof was 4.8 nm or less which was an accuracy required by the DRAM hp32 nm design rule.

Example 2

A reflective mask blank was manufactured in the same manner as in Example 1 except that, in the reflective mask blank of Example 1, the absorber film was laminated on the upper surface of the protective film without forming the buffer film.

Further, using the manufactured reflective mask blank, a reflective mask was manufactured through the same processes as in Example 1 except the process of dry-etching the buffer film.

With respect to the manufactured reflective mask, a final confirmation inspection was carried out using ArF excimer laser light (wavelength 193 nm) in the same manner as in Example 1. That is, the final confirmation inspection of the obtained reflective mask was carried out using the ArF excimer laser light (wavelength 193 nm) as inspection light. The contrast for the ArF excimer laser inspection light was such that reflectance from the absorber film: reflectance from the multilayer reflective film having the protective film=9.5%: 58.1%=1:6.12. Thus, it was confirmed that it was possible to obtain sufficient contrast in the pattern inspection of the absorber film. Further, as a result of the pattern inspection of the reflective mask, it was confirmed that a pattern of the DRAM hp32 nm generation of the design rule was formed as designed. Further, the reflectance for EUV exposure light in the reflection area hardly changed as compared with the reflectance measured in the form of the multilayer reflective film coated substrate and it was 65.8%.

Further, using this reflective mask, pattern transfer onto a semiconductor substrate was carried out in the same manner as in Example 1 and it was confirmed that the mask contrast of the reflective mask of this Example was as high as 1:1000 at a peak wavelength and as high as 1:250 even over the entire wavelength band of the EUV light and that the mask accuracy thereof was 4.8 nm or less which was an accuracy required by the DRAM hp32 nm design rule.

Example 3

A reflective mask blank was manufactured in the same manner as in Example 2 except that, in the reflective mask blank of Example 2, CrOCN was used as the uppermost layer of the absorber film. The composition ratio of the CrOCN film was such that Cr was 33 at %, O was 39 at %, C was 11 at %, and N was 17 at %.

Further, using the manufactured reflective mask blank, a reflective mask was manufactured through the same processes as in Example 2 except a process of dry-etching the uppermost layer of the absorber film using a mixed gas of chlorine and oxygen.

With respect to the manufactured reflective mask, a final confirmation inspection was carried out using ArF excimer laser light (wavelength 193 nm) in the same manner as in Example 1. That is, the final confirmation inspection of the obtained reflective mask was carried out using the ArF excimer laser light (wavelength 193 nm) as inspection light. The contrast for the ArF excimer laser inspection light was such that reflectance from the absorber film: reflectance from the multilayer reflective film having the protective film=9.4%: 58.1%=1:6.18. Thus, it was confirmed that it was possible to obtain sufficient contrast in the pattern inspection of the absorber film. Further, as a result of the pattern inspection of the reflective mask, it was confirmed that a pattern of the DRAM hp32 nm generation of the design rule was formed as designed. Further, the reflectance for EUV exposure light in the reflection area hardly changed as compared with the reflectance measured in the form of the multilayer reflective film coated substrate and it was 65.8%.

Further, using this reflective mask, pattern transfer onto a semiconductor substrate was carried out in the same manner as in Example 1 and it was confirmed that the mask contrast of the reflective mask of this Example was as high as 1:1000 at a peak wavelength and as high as 1:250 even over the entire wavelength band of the EUV light and that the mask accuracy thereof was 4.8 nm or less which was an accuracy required by the DRAM hp32 nm design rule.

Example 4

A reflective mask blank was manufactured in the same manner as in Example 1 except that, in the reflective mask blank of Example 3, CrN was used as the lower layer of the absorber film.

Further, using the manufactured reflective mask blank, a reflective mask was manufactured through the same processes as in Example 1 except that the thickness of the resist film was set to 150 nm and that the uppermost layer and the lower layer of the absorber film were dry-etched using a mixed gas of chlorine and oxygen.

With respect to the manufactured reflective mask, a final confirmation inspection was carried out using ArF excimer laser light (wavelength 193 nm) in the same manner as in Example 1. That is, the final confirmation inspection of the obtained reflective mask was carried out using the ArF excimer laser light (wavelength 193 nm) as inspection light. The contrast for the ArF excimer laser inspection light was such that reflectance from the absorber film: reflectance from the multilayer reflective film having the protective film=9.8%: 58.2%=1:5.94. Thus, it was confirmed that it was possible to obtain sufficient contrast in the pattern inspection of the absorber film. Further, as a result of the pattern inspection of the reflective mask, it was confirmed that a pattern of the DRAM hp45 nm generation of the design rule was formed as designed. Further, the reflectance for EUV exposure light in the reflection area hardly changed as compared with the reflectance measured in the form of the multilayer reflective film coated substrate and it was 66.0%.

Further, using this reflective mask, pattern transfer onto a semiconductor substrate was carried out in the same manner as in Example 1 and it was confirmed that the mask contrast of the reflective mask of this Example was as high as 1:1000 at a peak wavelength and as high as 1:250 even over the entire wavelength band of the EUV light and that the mask accuracy thereof was 6.8 nm or less which was an accuracy required by the DRAM hp45 nm design rule.

Example 5

A reflective mask blank was manufactured in the same manner as in Example 1 except that, in the reflective mask blank of Example 2, CrN was used as the lower layer of the absorber film (i.e. the uppermost layer of the absorber film was made of SiON).

Further, using the manufactured reflective mask blank, a reflective mask was manufactured through the same processes as in Example 1 except that the lower layer of the absorber film was dry-etched using a mixed gas of chlorine and oxygen.

With respect to the manufactured reflective mask, a final confirmation inspection was carried out using ArF excimer laser light (wavelength 193 nm) in the same manner as in Example 1. That is, the final confirmation inspection of the obtained reflective mask was carried out using the ArF excimer laser light (wavelength 193 nm) as inspection light. The contrast for the ArF excimer laser inspection light was such that reflectance from the absorber film: reflectance from the multilayer reflective film having the protective film=9.2%: 58.0%=1:6.30. Thus, it was confirmed that it was possible to obtain sufficient contrast in the pattern inspection of the absorber film. Further, as a result of the pattern inspection of the reflective mask, it was confirmed that a pattern of the DRAM hp32 nm generation of the design rule was formed as designed. Further, the reflectance for EUV exposure light in the reflection area hardly changed as compared with the reflectance measured in the form of the multilayer reflective film coated substrate and it was 66.0%.

Further, using this reflective mask, pattern transfer onto a semiconductor substrate was carried out in the same manner as in Example 1 and it was confirmed that the mask contrast of the reflective mask of this Example was as high as 1:1000 at a peak wavelength and as high as 1:250 even over the entire wavelength band of the EUV light and that the mask accuracy thereof was 4.8 nm or less which was an accuracy required by the DRAM hp32 nm design rule.

Description of Symbols
1 substrate
2 multilayer reflective film
3 buffer film
4 absorber film
4a lower layer
4b uppermost layer
5 resist film
6 protective film
10 reflective mask blank
20 reflective mask
50 pattern transfer apparatus

The invention claimed is:

1. A reflective mask blank, comprising:
a substrate,
a multilayer reflective film formed on the substrate and adapted to reflect exposure light,
a protective film formed on the multilayer reflective film and composed mainly of ruthenium (Ru) or its compound,
a tantalum-based material film formed on the protective film and mainly containing tantalum (Ta), and
an upper layer formed on the tantalum-based material film, wherein the upper layer does not substantially contain tantalum (Ta) and is formed of a material composed mainly of a nitride, an oxide, an oxynitride, a carbide, a carbonitride, or an oxycarbonitride of at least one or more elements selected from silicon (Si) and chromium (Cr).

2. The reflective mask blank according to claim 1, wherein the upper layer is formed of a material containing CrN, CrNO or CrOCN.

3. The reflective mask blank according to claim 2, wherein the upper layer contains nitrogen, and a content of the nitrogen falls within a range of 15 to 60 at %.

4. The reflective mask blank according to claim 2, wherein the upper layer contains oxygen, and a content of the oxygen falls within a range of 15 to 60 at %.

5. The reflective mask blank according to claim 1, wherein a thickness of the upper layer is set to 5 to 30 nm.

6. The reflective mask blank according to claim 1, wherein the upper layer is formed of a material composed mainly of a nitride, an oxide, an oxynitride, a carbide, a carbonitride, or an oxycarbonitride of silicon (Si), and
a buffer film composed mainly of chromium (Cr) is provided between the protective film and the tantalum-based material film.

7. The reflective mask blank according to claim 1, wherein the upper layer is formed of a material containing $Si_3N_4$, $SiO_2$, SiON or SiC.

8. The reflective mask blank according to claim 1, wherein the upper layer is formed of a material composed mainly of a nitride, an oxide, an oxynitride, a carbide, a carbonitride, or an oxycarbonitride of silicon and further contains molybdenum (Mo).

9. The reflective mask blank according to claim 1, wherein the upper layer contains silicon (Si) and nitrogen, and a content of the nitrogen falls within a range of 15 to 60 at %.

10. The reflective mask blank according to claim 1, wherein the upper layer contains silicon (Si) and oxygen, and a content of the oxygen falls within a range of 15 to 60 at %.

11. The reflective mask blank according to claim 1, wherein the upper layer further contains boron (B).

12. The reflective mask blank according to claim 1, wherein the tantalum-based material film contains tantalum (Ta), boron (B), and nitrogen (N).

13. The reflective mask blank according to claim 1, wherein the protective film is composed mainly of a ruthenium compound containing ruthenium (Ru) and niobium (Nb).

14. The reflective mask blank according to claim 1, wherein a resist film is formed on the reflective mask blank.

15. A method of manufacturing a reflective mask, comprising:

dry-etching the upper layer of the reflective mask blank according to claim 1 using a mixed gas of chlorine and oxygen.

16. A method of manufacturing a reflective mask, comprising:

dry-etching the tantalum-based material film of the reflective mask blank according to claim 1 using a chlorine gas.

17. A method of manufacturing a semiconductor device, comprising:

carrying out exposure transfer with EUV light onto a semiconductor substrate by a pattern transfer apparatus using the reflective mask manufactured by the method according to claim 15.

18. A method of manufacturing a semiconductor device, comprising:

carrying out exposure transfer with EUV light onto a semiconductor substrate by a pattern transfer apparatus using the reflective mask manufactured by the method according to claim 16.

* * * * *